US008784167B2

(12) United States Patent
Yi

(10) Patent No.: US 8,784,167 B2
(45) Date of Patent: Jul. 22, 2014

(54) FAN SUSPENSION FOR REDUCTION OF NOISE

(75) Inventor: George Youzhi Yi, Fremont, CA (US)

(73) Assignee: Cisco Technology, Inc., San Jose, CA (US)

( * ) Notice: Subject to any disclaimer, the term of this patent is extended or adjusted under 35 U.S.C. 154(b) by 1533 days.

(21) Appl. No.: 11/953,539

(22) Filed: Dec. 10, 2007

(65) Prior Publication Data
US 2009/0147473 A1 Jun. 11, 2009

(51) Int. Cl.
H05K 5/00 (2006.01)
H05K 7/20 (2006.01)

(52) U.S. Cl.
USPC ............ 454/184; 361/679.49; 361/695

(58) Field of Classification Search
USPC ......... 454/184; 361/679.48, 679.49, 690–697
See application file for complete search history.

(56) References Cited

U.S. PATENT DOCUMENTS

| 4,517,880 | A | * | 5/1985 | Buckner et al. | 454/184 |
| 5,562,410 | A | | 10/1996 | Sachs et al. | |
| 6,215,659 | B1 | * | 4/2001 | Chen | 361/695 |
| 6,236,564 | B1 | * | 5/2001 | Fan | 361/695 |
| 6,244,953 | B1 | * | 6/2001 | Dugan et al. | 454/184 |
| 6,343,012 | B1 | * | 1/2002 | Rife | 361/695 |
| 6,464,578 | B1 | * | 10/2002 | Chin et al. | 454/184 |
| 6,556,437 | B1 | | 4/2003 | Hardin | |
| 6,611,427 | B1 | | 8/2003 | Liao | |
| 6,616,525 | B1 | | 9/2003 | Giraldo et al. | |
| 6,625,019 | B1 | | 9/2003 | Steinman et al. | |
| 6,646,877 | B2 | | 11/2003 | Willers et al. | |
| 6,663,416 | B2 | | 12/2003 | Huang et al. | |
| 6,690,576 | B2 | | 2/2004 | Clements et al. | |
| 6,700,779 | B2 | | 3/2004 | Hanson et al. | |
| 6,768,640 | B2 | | 7/2004 | Doblar et al. | |
| 6,795,314 | B1 | | 9/2004 | Arbogast et al. | |
| 6,808,411 | B2 | | 10/2004 | Chen | |
| 6,865,078 | B1 | | 3/2005 | Chang | |
| 6,896,611 | B2 | | 5/2005 | Giraldo et al. | |
| 6,930,882 | B2 | * | 8/2005 | Broder et al. | 361/695 |
| 7,002,797 | B1 | | 2/2006 | Wittig | |
| 7,004,726 | B2 | | 2/2006 | Kuo | |
| 7,009,841 | B2 | | 3/2006 | Chen et al. | |
| 7,021,895 | B2 | | 4/2006 | Rubenstein et al. | |
| 7,033,206 | B2 | | 4/2006 | Chang et al. | |
| 7,054,155 | B1 | | 5/2006 | Mease et al. | |
| 7,126,819 | B2 | * | 10/2006 | Liang | 361/695 |
| 7,173,822 | B2 | | 2/2007 | Liang et al. | |
| 7,239,528 | B1 | | 7/2007 | McLeod | |
| 7,251,135 | B2 | | 7/2007 | Crippen et al. | |

(Continued)

FOREIGN PATENT DOCUMENTS

JP 2002156179 A 5/2002

Primary Examiner — Craig Schneider
Assistant Examiner — Jonathan Waddy
(74) Attorney, Agent, or Firm — Novak Druce Connolly Bove + Quigg LLP

(57) ABSTRACT

The electronic system has a chassis having a base and a set of flanges extending from the base. The electronic system has electronic circuitry housed within the chassis. The electronic system has a fan assembly having a fan arranged to generate an air stream suitable for cooling the electronic circuitry, and a fan mount. The fan mount has an attachment portion arranged to attach to the fan. The fan mount has a set of chassis interface portions arranged to form a cantilever with the set of flanges relative to the base to vibrationally isolate the fan from the base.

24 Claims, 4 Drawing Sheets

(56) References Cited

U.S. PATENT DOCUMENTS

| | | |
|---|---|---|
| 7,253,743 B2 | 8/2007 | Liang et al. |
| 7,262,962 B1 | 8/2007 | McLeod et al. |
| 7,306,425 B2 | 12/2007 | Park et al. |
| 7,326,032 B2 | 2/2008 | Vinson et al. |
| 7,515,413 B1 | 4/2009 | Curtis |
| 2003/0228840 A1* | 12/2003 | Gough et al. ................ 454/184 |

* cited by examiner

FAN SUSPENSION FOR REDUCTION OF NOISE

BACKGROUND

Conventional circuit boards typically include components which generate heat during operation. These components may require enhanced cooling in order to operate properly and avoid damage. For example, microprocessors typically rely on heat sinks disposed within air streams to maintain the microprocessors within predefined optimized temperature ranges.

One conventional approach to providing an air stream suitable for cooling electronic components is to place a set of fans at an inlet opening of a chassis which houses the components. The set of fans draw ambient air from the front of the chassis, and blow that air through the chassis and over the components. The air then exits out from the outlet opening of the chassis carrying away heat from the components.

To prevent the fans from inadvertently unfastening from the chassis, hardware (e.g., screws, nuts, etc.) directly secures the fans to the chassis. In particular, such hardware typically inserts through holes in the frames of the fans and then attaches to the chassis through mounting holes of the chassis. If the fans are installed properly, the hardware competently holds the fans in place.

BRIEF DESCRIPTION OF THE DRAWINGS

The foregoing and other objects, features and advantages will be apparent from the following description of particular embodiments of the invention, as illustrated in the accompanying drawings in which like reference characters refer to the same parts throughout the different views. The drawings are not necessarily to scale, emphasis instead being placed upon illustrating the principles of various embodiments of the invention.

DETAILED DESCRIPTION

Overview

Figure 1:
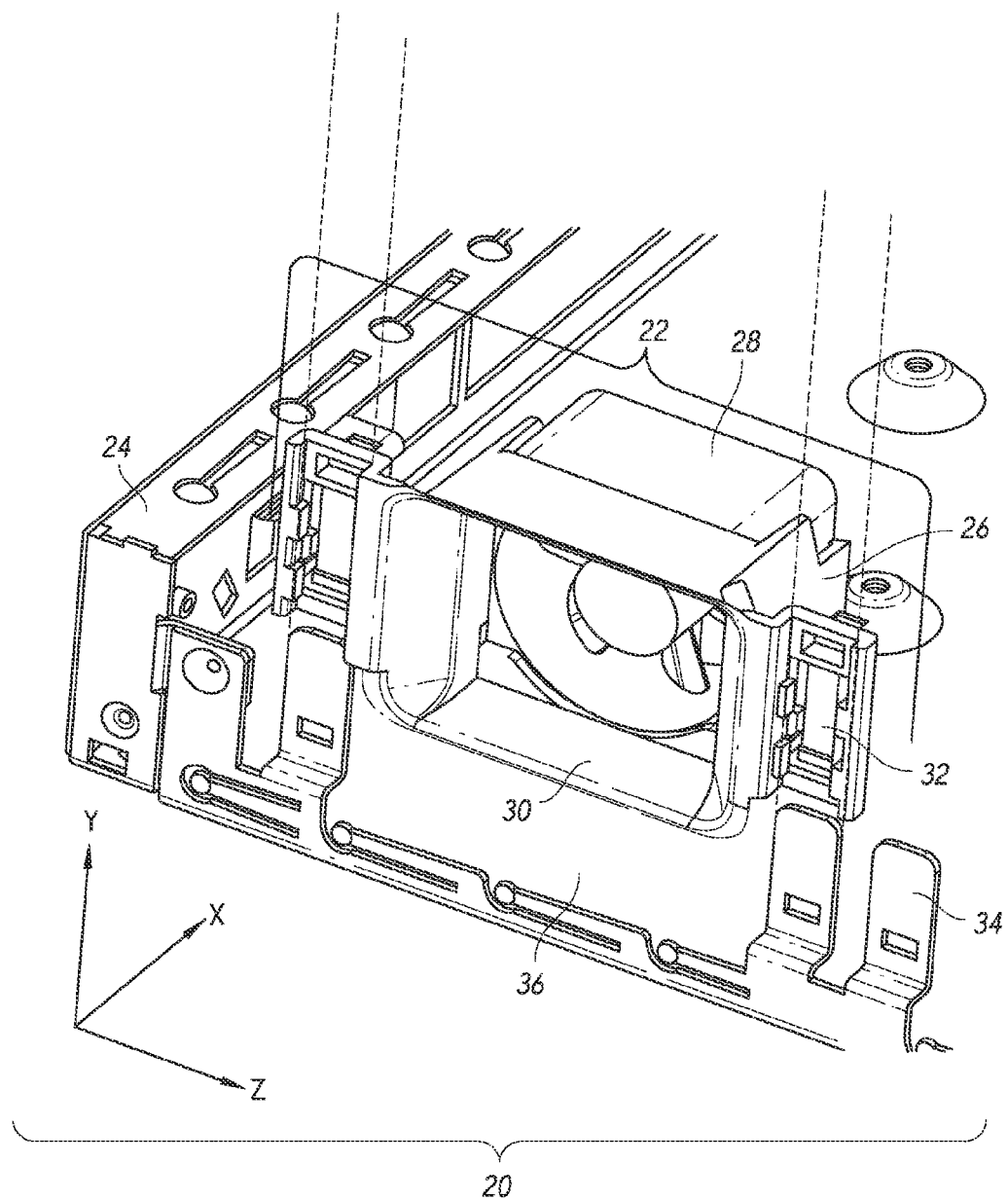
FIG. 1 is a perspective view of an electronic system having a fan, an improved fan assembly, and a metal chassis.

Unfortunately there are deficiencies to the above-described conventional approaches to securing a fan to a chassis using hardware. For example, with such an approach vibrations of the fan may be transferred to the chassis. This may cause the entire chassis to resonate and amplify the noise of the fan. Computer systems have become increasingly more crowded as designers seek to produce faster and more powerful systems. Since space is limited in computer systems, increased cooling is usually achieved by increased fan speed. As fan speed increases, so too does the acoustic noise from the fan increase. Noise is generated by the turbulence of the airflow resulting from air being forced through the fan. Noise is also generated by vibration of the fan itself, due to the running of the fan motor and the spinning of its fan blades. The fan vibration is transferred from the fan to the chassis to which the fan is affixed. The acoustic noise is amplified when the fan runs at the speed that falls within the system resonance frequency range. This amplification in noise can be a major annoyance for those individuals who must work close to these electronic systems.

Another deficiency to the above described conventional fan mount is the excess hardware that can come loose from the fan. This hardware can fall into the circuitry to cause physical damage or short circuits. The excess hardware creates a reliability concern. In addition, excess hardware can mean additional complexity. This could result in greater costs associated with manufacture and assembly.

In contrast to the above-identified conventional approach to securing a fan to a chassis using hardware, an improved fan mounting technique involves isolating vibrations of the fan from the chassis using a suspension assembly structure. Such a suspension assembly structure is capable of significantly reducing the vibration passed onto the chassis from the fan. Additionally, the suspension assembly structure design is capable of being formed by a one-piece fan mount/fastener in combination with a set of chassis flanges extending from a base of the chassis to enable simple and quick installation without using tools. As a result, there is less noise, little or no hardware to pose a reliability issue, and less manufacturing burden.

One embodiment is directed to an electronic system. The electronic system has a chassis having a base and a set of flanges extending from the base. The electronic system has electronic circuitry housed within the chassis. The electronic system has a fan assembly having a fan arranged to generate an air stream suitable for cooling the electronic circuitry, and a fan mount. The fan mount has an attachment portion arranged for the fan to attach to. The fan mount has a set of chassis interface portions arranged to form a cantilever with the set of flanges relative to the base to vibrationally isolate the fan from the base.

DESCRIPTION OF EXAMPLE EMBODIMENTS

An improvement to a fan assembly isolates the fan (e.g. 40 mm×40 mm×20 mm fan) from the chassis (e.g. sheet metal bracket) inside a vibration dampening fan mount. Accordingly, this significantly reduces the vibration passed onto the chassis from the fan, thus reducing the acoustic noise.

FIG. 1 shows an electronic system 20 which includes a set of fan assemblies 22 (i.e., one or more fan assemblies 22) and a metal chassis 24. Each fan assembly 22 includes a fan mount 26 and a fan 28. The fan mount 26 includes a fan housing 30 configured to be an attachment portion to attach to the fan 28 and a set of latches 32 (i.e., one or more latches 32) adapted to act as chassis interface portions which mount the housing 30 to the chassis 24. The chassis 24 includes a set of flanges 34 (i.e., one or more flanges 34) and a chassis bottom 36.

As shown in FIG. 1, the metal chassis 24 is a support structure designed to house and provide physical framework for various components. Potential components are electronic circuitry, wiring, power supplies, heat sinks, and fans 28. The set of flanges 34 rigidly integrate with the chassis 24. The flanges 34 as shown in the current embodiment are stamped and folded from sheet stock, and thus form as one piece with the rest of the chassis. However, the flanges 34 may attach to the chassis in various other ways to provide a good rigid attachment such as welding, bolting, or gluing. The flanges 34 extend from the chassis 24 in the positive Y direction.

As shown in FIG. 1, the fan assembly 22 is formed by attaching the fan 28 to the fan mount 26. The fan mount 26 holds the fan 28 firmly in place. The fan 28 as shown in the current embodiment snap fits to the fan mount 26. However, the fan 28 may attach to the fan mount 26 in various other ways including screws, friction fits, and clamps. The fan mount 26 contains the set of latches 32. The latches 32 extend from the fan mount 26 in the positive and negative Z direction. The latches 32 have an opening on the negative Y side.

As shown in FIG. 1, as the fan assembly 22 lowers onto the chassis 24 in the negative Y direction, the flanges 34 engage the latches 32. Upon engaging the latches 32, the flanges 34 enter the opening of the latches 32. As the flanges 34 enter the opening of the latches 32, the latches 32 are forced to deform towards the X direction for the flanges 34 to enter. Once the flanges 34 have fully entered the latches 32, the latches 32 return to (snap-in) their original shape and the connection between the latches 32 and the flanges 34 are locked in place. When the set of latches 32 has fully engaged the set of flanges 34, there is no contact between fan assembly 22 and the chassis bottom 36. Thus the fan assembly 22 is suspended by a cantilever structure with respect to the chassis bottom 36 via the latches 32 to flanges 34 connection. In other words, a spatial gap 62 exists between fan assembly 22 and the chassis bottom 36. This cantilever formation serves to dampen any vibrations that occur when the fan 28 operates. Thus vibrations of fan 28 are substantially isolated from the chassis 24. Since the chassis 24 cannot be resonant with the vibrations generated by the fan 28, the noise level is substantially lower when compared to the noise produced by the conventional fan mount with a sheet metal bracket.

Figure 2:
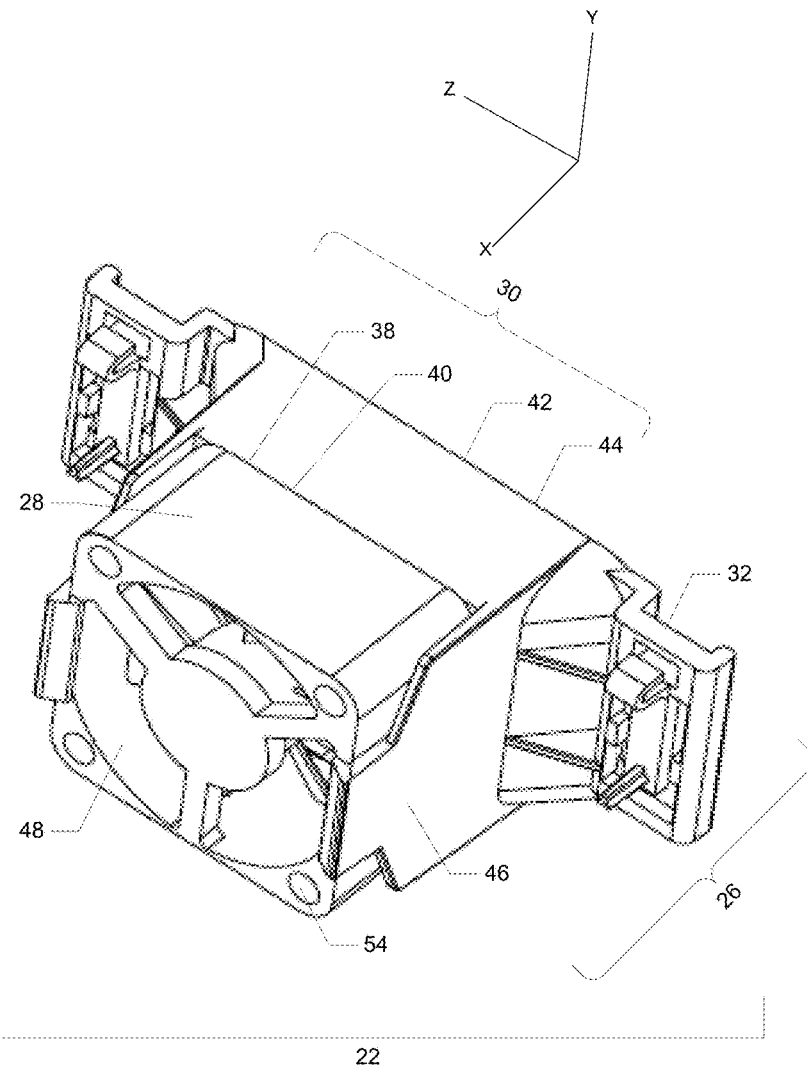
FIG. 2 is a perspective view of a portion of the electronic system of FIG. 1 when the chassis is disconnected from the fan assembly having a fan mount and a fan.

FIG. 2 shows the fan assembly 22 in greater detail and from the opposite side than in FIG. 1. The fan assembly 22 includes the fan 28 inserted into the housing 30. The housing 30 includes a mating panel 38 defining a seating surface 40 configured to mate with a fan 28. The housing 30 also includes an inlet vent 42 defining an inlet vent opening 44. The housing 30 also includes a set of walls 46 (i.e., one or more walls 46) connected to the seating surface 40. The set of walls 46 protrude from the seating surface 40 to form a component that defines a fan space 48. The fan 28 inserts into the fan space 48 until the fan contacts the seating surface.

As shown in FIG. 2, the set of walls 46 extend in the X direction from edges of the seating surface 40 in the XY plane. The set of walls 46 act as a positioning and retaining feature for the fan 28 upon its insertion into the fan mount 26. Though the set of walls 46 are depicted in the XY plane, they would work just as effectively in the XZ plane in addition to or in lieu of the set of walls 46 in the XY plane.

As shown in FIG. 2, the housing 30 has a set of snap-in couplings 50 (i.e., one or more snap-in couplings 50) attached to the set of walls 46. As the fan 28 inserts into the fan space 48 in the negative X direction, the couplings 50 deflect open. When the fan 28 contacts the seating surface 40, the snap-in couplings 50 return to their original position and the fan 28 locks into place by couplings 50.

As shown in FIG. 2, the fan 28 fits snuggly into the fan space 48 of the housing 30. This snug fit prevents the fan 28 from jostling around in the fan mount 26 and producing extra noise. The vibrations of the fan 28 are passed onto and shared with the fan mount 26 and are then dampened by the cantilever formation.

Figure 3:
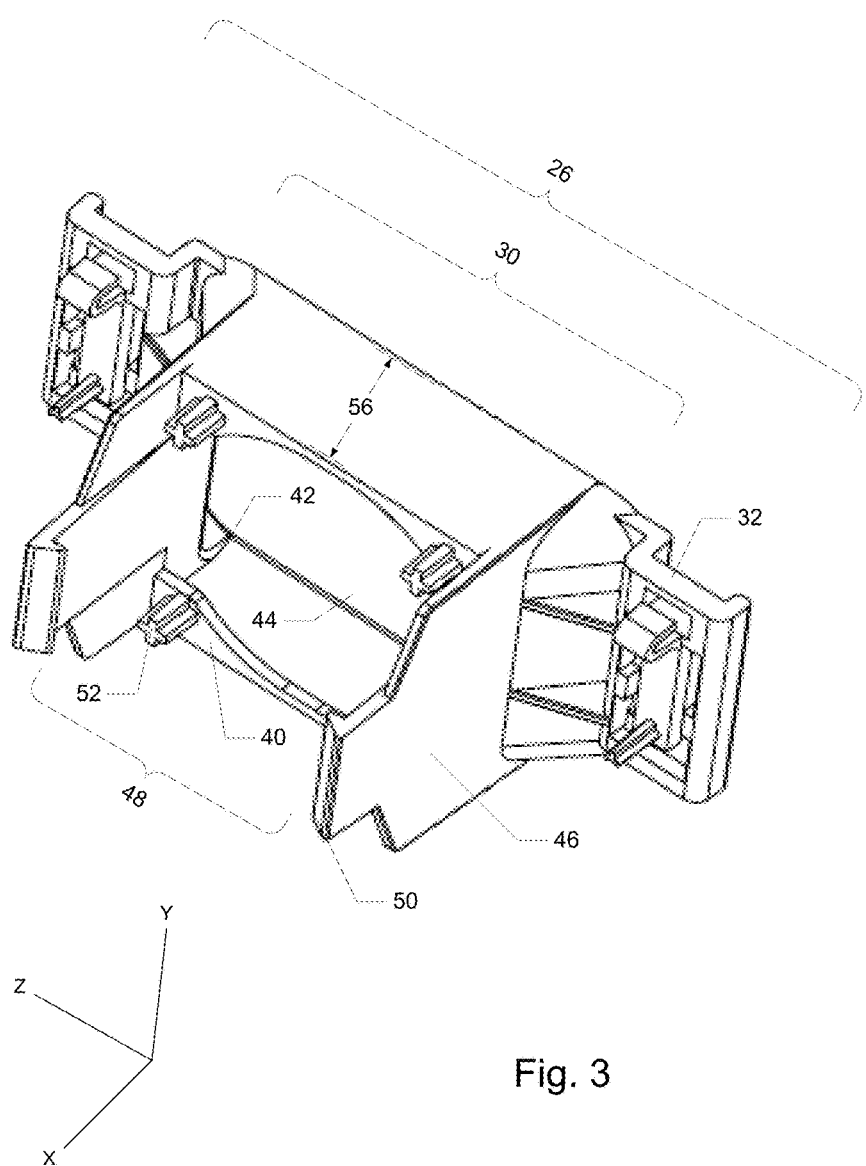
FIG. 3 is a perspective view of a portion of the electronic system of FIGS. 1 and 2 when a fan is disconnected from the fan mount.

FIG. 3 shows the fan assembly 22 as seen in FIG. 2 but with the fan 28 removed from the assembly 22 to reveal only the fan mount 26. The housing 30 includes a set of posts 52 (i.e. one or more posts 52). When the fan 28 inserts into the fan space 48 as described above, a set of fan holes 54 (i.e. one or more fan holes) as seen in FIG. 2 on the fan 28 line up with the set of posts 52. The posts 52 then insert into the fan holes 54 in the X direction. In conjunction with the snap in couplings 50, the posts 52 aid in the locking of fan 28 into the housing 30.

As shown in FIG. 3, the set of posts 52 attach to the seating surface 40 of the mating panel 38. The posts 52 are cross shaped and tapered so that the diameter of the post is slightly larger on the side attached to the seating surface 40 of the mating panel 38. This geometry allows the posts 52 to fit snuggly inside the fan holes 54 while still allowing for easy removal of the posts 52. There are other geometries for posts 52 that can act as good stabilizers, such as cylindrical or box shaped.

In one embodiment, the entire housing 30 and set of latches 32 are made entirely in one piece. This can be done for example by using an injection molded plastic construction. This makes the fan mount 26 easy and inexpensive to produce. By reducing the number of pieces that are affixed together it prevents excess pieces from clattering against each other to produce additional noise. Reducing the number of pieces prevents small pieces from coming loose and falling onto the circuitry. If pieces were to fall onto the circuitry, there is the possibility that short circuits could occur.

Figure 4:
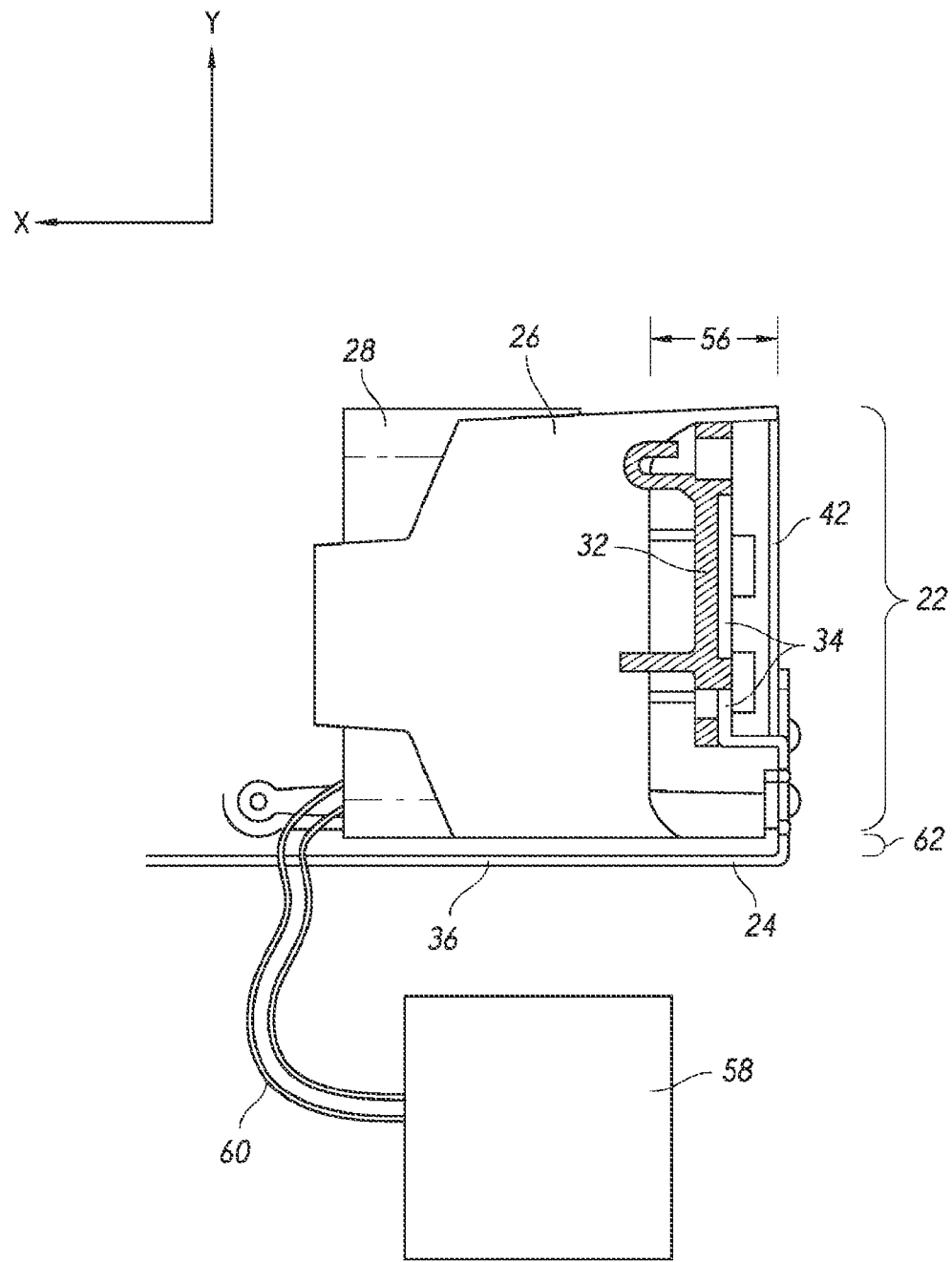
FIG. 4 is a cross-sectional side view of various components of the electronic system of FIG. 2.

FIG. 4 shows the electronic system 20 from the side which includes a separating structure 56. The fan 28 is connected to a power source 58 on the chassis 24 by a set of wires 60 (i.e., one or more wires).

The separating structure 56 is an extension of material that creates some separation between the seating surface 40 and the inlet vent 42. As air passes through the inlet vent 42 on its way to the fan 28, the air is subject to turbulent flow. This turbulence creates audible noise. Both turbulence and noise are decreased as the separating structure 56 becomes longer. The length of the separating structure is a compromise between the noise reducing features of longer lengths and practicality of shorter lengths. For exemplary purposes his length turns out to be approximately 0.4 inches and longer.

As shown in FIG. 4, the bottom of the fan mount 26 does not contact the metal chassis 24. This ensures that the cantilever is formed so that the only rigid point of contact between the chassis 24 and the fan assembly 22 is the latches 32 on flanges 34 connection. The wires 60 are not rigid attachments and do not pass on significant vibration noise.

While this invention has been particularly shown and described with references to preferred embodiments thereof, it will be understood by those skilled in the art that various changes in form and details may be made therein without departing from the spirit and scope of the invention as defined by the appended claims.

For example, the position of the flanges 34 and the latches 32 could be swapped to achieve the same cantilever formation.

What is claimed is:

1. A fan assembly, comprising:
   a fan arranged to generate an air stream suitable for cooling electronic circuitry; and
   a fan mount having:
   (i) a set of chassis interface portions having;
   a set of openings disposed at a bottom-front of the fan mount for receiving a set of flanges extending from a chassis, and
   a set of snap-in couplings locking the fan mount in a position relative to a base of the chassis, and
   (ii) an attachment portion disposed proximate to a rear of the fan mount and arranged to hold the fan in a location behind the set of chassis interface portions, wherein the set of chassis interface portions forms the only structure for rigidly attaching the fan mount to the chassis and wherein the set of flanges engage the set of chassis interface portions to hold the fan assembly in a suspended arrangement above the base of the chassis with no contact between the fan assembly and the base of the chassis.

2. The fan assembly of claim 1 wherein the attachment portion includes:
an inlet vent defining an opening adapted to provide passage for the air stream to the fan, the inlet vent defining an axial direction;
a set of walls connected to the inlet vent, the set of walls and the inlet vent forming a component that defines a fan space with the fan in the axial direction; and
a mating panel defining a seating surface configured to mate with the fan.

3. The fan assembly of claim 2 wherein the fan mount further includes a separating structure that recesses the mating panel from the inlet vent to reduce the turbulence of the air stream through the inlet vent.

4. The fan assembly of claim 2 wherein the attachment portion and the chassis interface portions are formed as a unitary body of homogenous plastic material by injection molding.

5. The fan assembly of claim 2 wherein the fan mount further includes a second set of snap-in couplings, the second set of snap-in couplings restraining movement of the fan in the axial direction.

6. The fan assembly of claim 5 further comprising:
a set of posts on the attachment portion, and
a mounting region on the fan defining a set of mounting holes adapted to receive the set of posts and to position the fan relative to the fan mount.

7. A fan mount, comprising:
a set of chassis interface portions having:
a set of openings disposed at a bottom-front of the fan mount for receiving a set of flanges extending from a chassis, and
a set of snap-in couplings locking the fan mount in a position relative to a base of the chassis; and
an attachment portion disposed proximate to a rear of the fan mount and arranged to hold a fan in a location behind the set of chassis interface portions,
wherein the set of chassis interface portions forms the only structure for rigidly attaching the fan mount to the chassis, and
wherein the set of flanges engage the set of chassis interface portions to hold the fan mount in a suspended arrangement above the base of the chassis with no contact between the fan mount and the base of the chassis.

8. The fan mount of claim 7 wherein the attachment portion includes:
an inlet vent defining an opening adapted to provide passage for the air stream to the fan, the inlet vent defining an axial direction;
a set of walls connected to the inlet vent, the set of walls and the inlet vent forming a component that defines a fan space with the fan in the axial direction; and
a mating panel defining a seating surface configured to mate with the fan.

9. The fan mount of claim 8 wherein the fan mount further includes a separating structure that recesses the mating panel from the inlet vent to reduce the turbulence of the air stream through the inlet vent.

10. The fan mount of claim 8 wherein the attachment portion, the chassis interface portions, the inlet vent, and the set of walls are formed as a unitary body of homogenous plastic material by injection molding.

11. The fan mount of claim 8 wherein the fan mount further includes a second set of snap-in couplings, the second set of snap-in couplings restraining movement of the fan in the axial direction.

12. The fan mount of claim 11 further comprising a set of posts on the attachment portion adapted to mate with the fan and to position the fan relative to the fan mount.

13. A method of fan noise reduction comprising:
coupling a fan to a fan mount to form a fan assembly, the fan mount having an attachment portion arranged to attach to the fan; and
coupling the fan mount to a chassis with a set of chassis interface portions, the set of chassis interface portions having (i) a set of openings disposed at a bottom-front of the fan mount for engaging flanges extending from a base of the chassis, and (ii) a set of snap-in couplings locking the fan mount in a position relative to the base of the chassis, the set of chassis interface portions forming the only rigid attachments of the fan mount to the chassis,
wherein, when the fan mount is coupled to the chassis, the fan mount is positioned with a front of the fan mount occupying an inlet opening of the chassis and the attachment portion extending behind the set of chassis interface portions which hold the fan assembly in a suspended arrangement above the base with no contact between the fan assembly and the base.

14. An electronic system, comprising:
a chassis having a base and a set of flanges extending from the base;
electronic circuitry housed within the chassis; and
a fan assembly having (i) a fan arranged to generate an air stream suitable for cooling the electronic circuitry, and (ii) a fan mount having:
a set of chassis interface portions having a set of openings disposed at a bottom-front of the fan mount for receiving the set of flanges; and
an attachment portion disposed proximate to a rear of the fan mount and arranged to hold the fan in a location behind the set of chassis interface portions,
wherein the set of chassis interface portions forms the only structure for rigidly attaching the fan mount to the chassis, and
wherein the set of flanges engage the set of chassis interface portions to hold the fan assembly in a suspended arrangement above the base with no contact between the fan assembly and the base.

15. The electronic system of claim 14 wherein the attachment portion includes:
an inlet vent defining an opening adapted to provide passage for the air stream to the fan, the inlet vent defining an axial direction;
a set of walls connected to the inlet vent, the set of walls and the inlet vent forming a component that defines a fan space with the fan in the axial direction; and
a mating panel defining a seating surface configured to mate with the fan.

16. The electronic system of claim 15 wherein the fan mount further includes a separating structure that recesses the mating panel from the inlet vent to reduce the turbulence of the air stream through the inlet vent.

17. The electronic system of claim 15 wherein the attachment portion and the chassis interface portions are formed as a unitary body of homogenous plastic material by injection molding.

18. The electronic system of claim 15 wherein the fan mount further includes a first set of snap-in couplings, the first set of snap-in couplings restraining movement of the fan in the axial direction.

19. The electronic system of claim 18 further comprising:
a set of posts on the attachment portion, and
a mounting region on the fan defining a set of mounting holes adapted to receive the set of posts and to position the fan relative to the fan mount.

20. The electronic system of claim 14 wherein the chassis interface portions include a set of snap-in couplings locking the fan mount to the set of flanges.

21. The electronic system of claim 14, wherein the set of flanges are arranged to provide a degree of flexibility relative to the base.

22. The electronic system of claim 21, wherein the set of flanges are formed as a set of continuous extensions of a vertical back surface of the chassis.

23. The electronic system of claim 14, wherein each of the set of flanges includes a first portion extending parallel to the base and a second portion extending from the first portion perpendicularly to the base.

24. An electronic system, comprising:
a chassis having a base and a set of flanges extending from the base;
electronic circuitry housed within the chassis; and
a fan assembly having a fan and a fan mount arranged to hold the fan within the chassis to generate an air stream suitable for cooling the electronic circuitry, the fan mount having:
    an attachment portion disposed proximate to a rear of the fan mount to hold the fan in a fixed position within the fan mount; and
    a set of openings disposed at a bottom-front of the fan mount into which the set of flanges are inserted to hold the fan assembly in a suspended arrangement over the base with no rigid attachment between the fan assembly and the chassis other than the set of flanges and with no contact between the fan assembly and the base of the chassis.

* * * * *